(12) United States Patent
Nishihata et al.

(10) Patent No.: US 6,853,872 B2
(45) Date of Patent: Feb. 8, 2005

(54) OPERATING METHOD OF VACUUM PROCESSING SYSTEM AND VACUUM PROCESSING SYSTEM

(75) Inventors: Kouji Nishihata, Tokuyama (JP); Kazuhiro Joo, Kudamatsu (JP); Shoji Ikuhara, Hikari (JP); Tetsuya Tahara, Hikari (JP); Shoji Okiguchi, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/140,182

(22) Filed: May 8, 2002

(65) Prior Publication Data

US 2002/0133256 A1 Sep. 19, 2002

Related U.S. Application Data

(63) Continuation of application No. 09/535,753, filed on Mar. 27, 2000, now Pat. No. 6,714,832, which is a continuation of application No. 08/925,190, filed on Sep. 8, 1997, now Pat. No. 6,069,096.

(30) Foreign Application Priority Data

Sep. 11, 1996 (JP) .......................................... 08-240147
Mar. 19, 1997 (JP) .......................................... 09-066097

(51) Int. Cl.[7] ............................................. G06F 19/00
(52) U.S. Cl. .................. 700/121; 700/21; 700/108; 700/109; 700/110; 702/128; 702/185; 702/35; 414/939; 414/940; 414/935; 438/905; 29/25.01
(58) Field of Search ........................ 700/21, 108–110, 700/121; 414/939, 940, 935; 702/128, 185, 35; 29/25.01; 438/905

(56) References Cited

U.S. PATENT DOCUMENTS 4,715,921 A * 12/1987 Maher et al. ........... 156/345.32
4,820,377 A *  4/1989 Davis et al. .................. 134/1.1
4,990,047 A *  2/1991 Wagner et al. ............... 414/217
5,076,205 A    12/1991 Vowles et al.
5,292,393 A *  3/1994 Maydan et al. ........ 156/345.32
5,314,509 A     5/1994 Kato et al.
5,616,208 A     4/1997 Lee
5,685,684 A    11/1997 Kato et al.
5,795,356 A     8/1998 Leveen
5,817,366 A    10/1998 Arai et al.

FOREIGN PATENT DOCUMENTS

| JP | 63-57734 | 4/1988 | |
|----|----------|--------|---|
| JP | 3-257945 | 11/1991 | |
| JP | 3-274746 | 12/1991 | |
| JP | A-07-326649 | 12/1995 | |
| JP | A-07-335711 | 12/1995 | |
| JP | 8-181184 | 7/1996 | |
| JP | 9-017838 | 1/1997 | |
| JP | 9-050948 | 2/1997 | |
| JP | A-09-064142 | 3/1997 | |
| JP | 9-159981 | 6/1997 | |
| JP | 9159981 | * 6/1997 | ............. G02F/1/13 |

* cited by examiner

Primary Examiner—Anthony Knight
Assistant Examiner—Thomas Pham
(74) Attorney, Agent, or Firm—Antonelli, Terry, Stout & Kraus, LLP

(57) ABSTRACT

A vacuum processing method and apparatus processing units for conducting processing, a transfer processing unit connected with the plurality of processing units for carrying wafers, and a control unit for controlling the processing units. A processing order information storing device stores a processing order of the wafers for the processing units, an operational information signal generating device generates an operational information signal indicating an operable or inoperable state of each of the processing units, an operational information signal storing device stores the operational information signal indicating the state of each of the processing units, and a control device matches and processes the processing order information and the operational information signal, and continues operation without using an inoperable processing unit while using other operable processing units.

10 Claims, 12 Drawing Sheets

FIG. 5

OPERATIONAL INFORMATION SIGNAL

| | |
|---|---|
| PROCESSING UNIT 2-1 | OPERABLE "1", INOPERABLE "0" |
| PROCESSING UNIT 2-2 | OPERABLE "1", INOPERABLE "0" |
| PROCESSING UNIT 2-3 | OPERABLE "1", INOPERABLE "0" |
| PROCESSING UNIT 2-4 | OPERABLE "1", INOPERABLE "0" |

FIG. 6

PROCESSING ORDER INFORMATION

| | |
|---|---|
| FIRST STEP | CASSETTE |
| SECOND STEP | LOAD LOCK CHAMBER |
| THIRD STEP | PROCESSING UNIT 2-1 |
| FOURTH STEP | PROCESSING UNIT 2-2 |
| FIFTH STEP | PROCESSING UNIT 2-3 |
| SIXTH STEP | PROCESSING UNIT 2-4 |
| SEVENTH STEP | UNLOAD LOCK CHAMBER |
| EIGHTH STEP | CASSETTE |

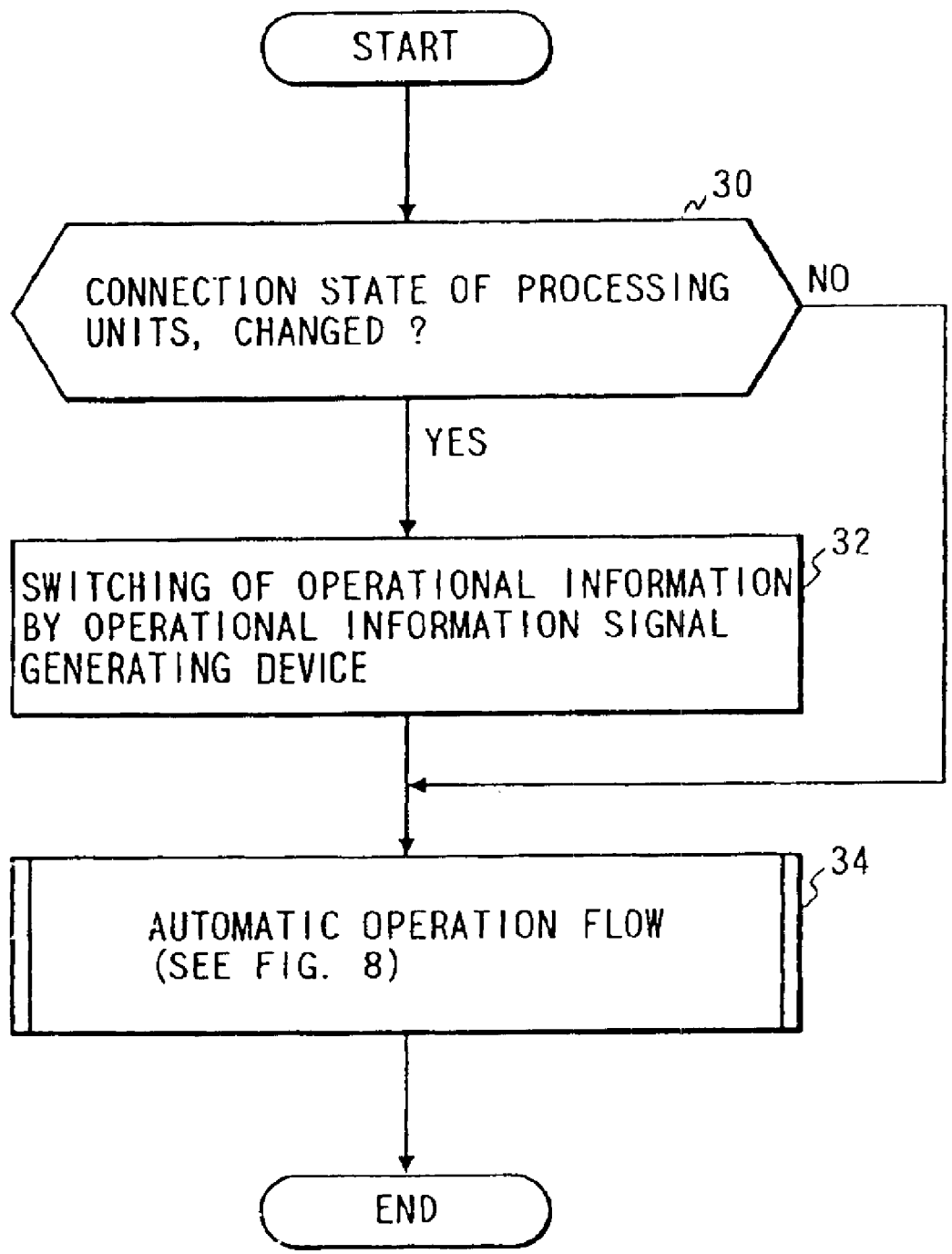

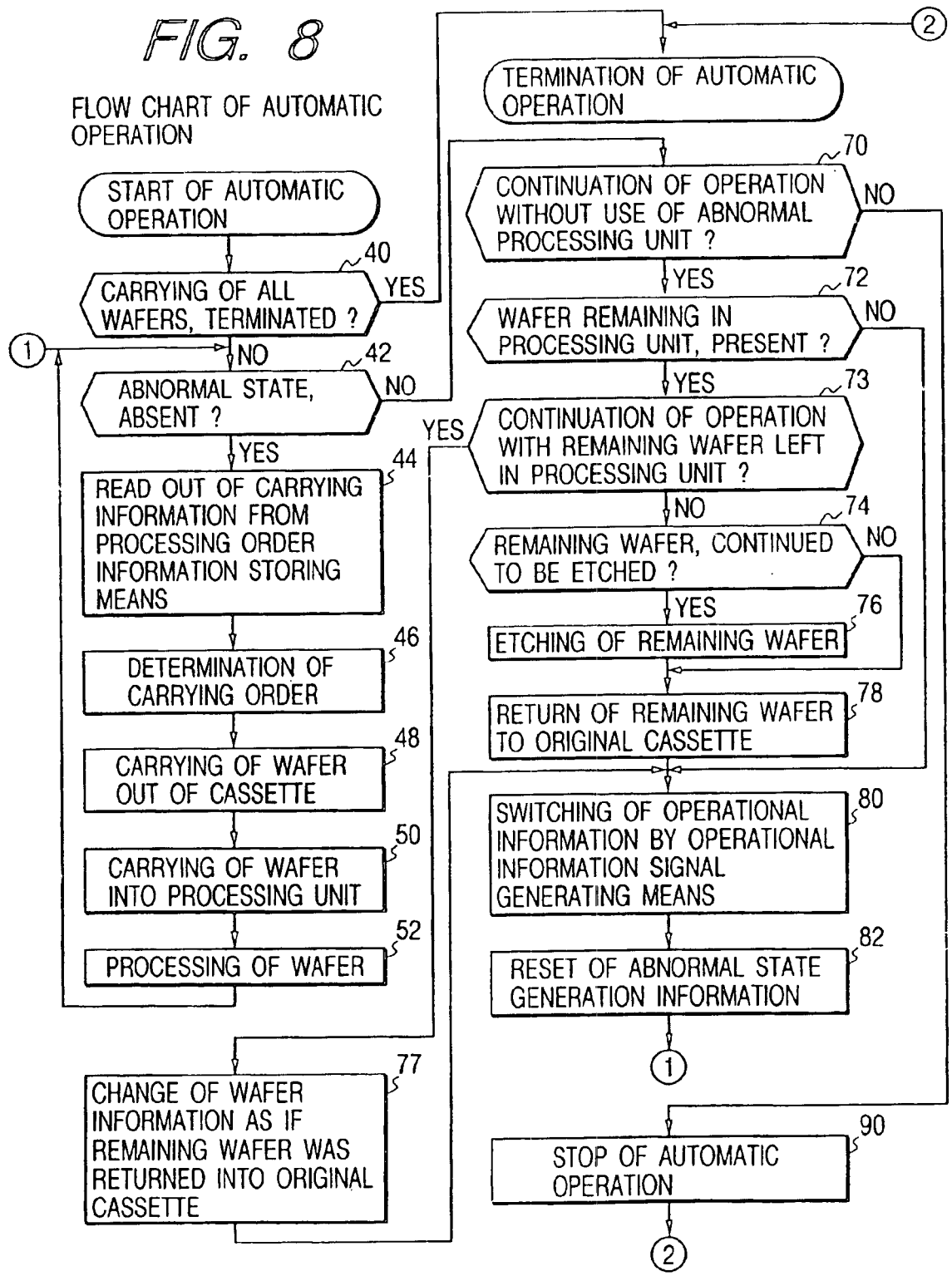

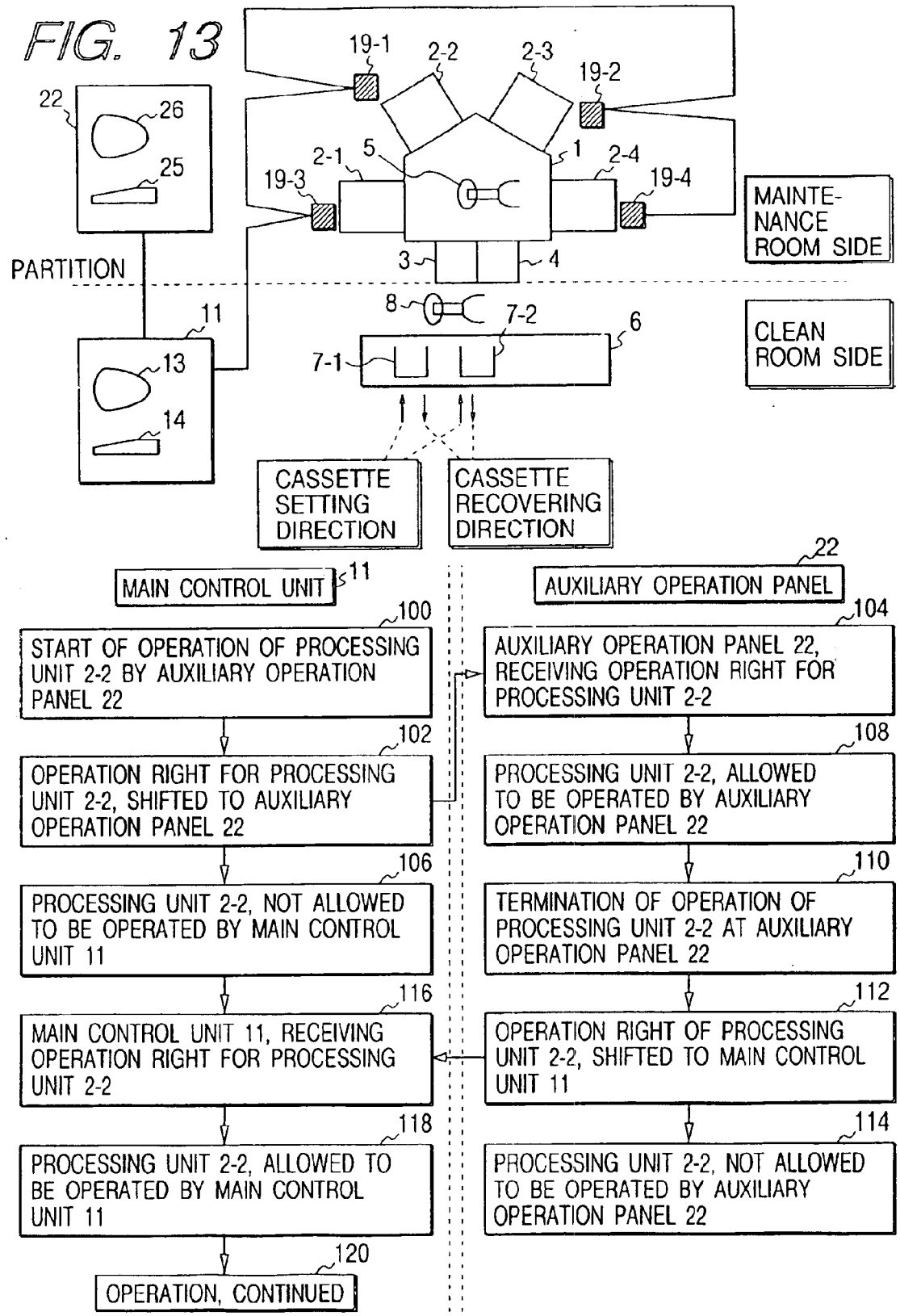

FIG. 14

| ITEM \ MODE | PARALLEL OPERATION OF ONE CASSETTE/ONE RECIPE | PARALLEL OPERATION OF TWO CASSETTES/ONE RECIPE | PARALLEL OPERATION OF TWO CASSETTES/TWO RECIPES | SERIES OPERATION OF ONE CASSETTE/ONE RECIPE |
|---|---|---|---|---|
| CARRYING ROUTE | ROUTE A / ROUTE B (ETCHING CHAMBER / ASHING CHAMBER) | ROUTE C / ROUTE D | ROUTE C / ROUTE D | ROUTE E |
| OUTLINE OF PROCESSING | PROCESSING OF C2 AFTER PROCESSING OF C1 | SIMULTANEOUS PROCESSING OF C1 AND C2 | SIMULTANEOUS PROCESSING OF C1 AND C2 AT DIFFERENT RECIPES | SERIES PROCESSING OF TWO CHAMBERS |
| OPERATION OF CASSETTES C1 AND C2 | SEQUENTIAL PROCESSING | SIMULTANEOUS PROCESSING | SIMULTANEOUS PROCESSING | SEQUENTIAL PROCESSING |
| RECIPES OF CASSETTES C1 AND C2 | SAME RECIPE | SAME RECIPE | DIFFERENT RECIPES | SAME RECIPE |
| TYPICAL PROCESSING | STANDARD PROCESSING | ↓ | EFFECTIVE FOR MULTIPLE KINDS OF PRODUCTS | EFFECTIVE FOR ETCHING OF MULTI-LAYERED FILM |
| DESIGNATION OF CARRYING ROUTE | POSSIBLE | POSSIBLE | POSSIBLE | POSSIBLE |

C1 IS EQUIVALENT TO 7-1 AND C2 IS EQUIVALENT TO 7-2

OPERATING METHOD OF VACUUM PROCESSING SYSTEM AND VACUUM PROCESSING SYSTEM

CROSS REFERENCE TO RELATED APPLICATION

This is a continuation of U.S. application Ser. No. 09/535,753, filed Mar. 27, 2000, now U.S. Pat. No. 6,714,832 which is a continuation of U.S. application Ser. No. 08/925,190, filed Sep. 8, 1997, now U.S. Pat. No. 6,069,096, the subject matter of which is incorporated by reference herein.

BACKGROUND OF THE INVENTION

The present invention relates to a method of operating a vacuum processing system including two or more processing units for processing wafers and a transferring unit for carrying the wafers, wherein the wafers are processed using at least two or more of the processing units; and, the invention further relates to a vacuum processing system for carrying out the method.

A system including a plurality of processing chambers connected to a carrying chamber, for example, as disclosed in Japanese Patent Laid-open No. 133532/1988, (hereinafter referred to as the first known method) is characterized in that, in a normal operating state, different wafers can be simultaneously carried into and processed in separate processing chambers, or each wafer can be carried into and processed sequentially in two or more of the processing chambers.

Another method of operating a processing system, for example, as disclosed in Japanese Patent Laid-open No. 274746/1991, (hereinafter referred to as the second known method) is characterized in that, in a operation wherein processing steps are performed simultaneously through processing chambers along two routes, if a processing chamber located along one route is undergoing maintenance work, processing chambers located along the other route are temporarily used for all of the processing steps to be performed along the two routes.

Thus, there has been known heretofore:

a system in which wafers are subjected to a plurality of processing steps in a vacuum by carrying wafers into two or more processing chambers through a carrying passage in a vacuum atmosphere and subjecting the wafers to processing steps inherent to the individual processing chambers; a method of carrying wafers into the processing chambers; and a method wherein maintenance work is performed simultaneously with the usual wafer processing.

The first known method, described in Japanese Patent Laid-open No. 133532/1988, however, has failed to examine a situation in which a processing chamber becomes inoperable because of a failure or the like during an operation using two or more processing chambers along a processing route, to suggest that the processing should be continued under such a condition using the remaining operable processing chambers, or to consider ways of recovery of the inoperable processing chamber.

The first known method also has failed to consider a method and procedure in which, if there is a processing chamber which is required to be repaired at the time of start of an operation, the system can still be operated using only the remaining operable processing chambers.

The first known method also has failed to consider a method and procedure in which, during an operation using two or more processing chambers along a processing route, when the operation is temporarily discontinued, a process interruption using as the processing route a processing chamber not normally used for the processing route prior to the operation being discontinued is carried out in priority, and wherein the processing which was temporarily discontinued is restarted after termination of the process interruption.

The first known method also has failed to consider, during an operation using two or more of the processing units as a processing route, the situation wherein an actuating instruction is supplied to apparatuses in a processing unit not currently used for the processing route from the point of view of securing a required level of safety of an operator when an auxiliary operating unit spaced from a main operating unit supplies the actuating instruction to the apparatuses in the processing chamber not used in the processing route for the operation.

On the other hand, the second known method, described in Japanese Patent Laid-open No. 274746/1991, has failed to consider a manner of securing the safety of the operator against a processing gas flowing due to "a wrong operation" or electric shock due to improper operation of a discharging power supply when maintenance work for exchange of a target or the like is performed by an operator standing on the side of components of the working system while the usual wafer processing is being performed.

Thus, although the known methods have examined the operation performed in a state wherein processing chambers are operable and in a state where a processing chamber which needs to be repaired is initially omitted before start of operation, they have failed to consider operation in a state wherein a processing chamber become inoperable during processing due to occurrence of an abnormal state, a process interruption, a temporarily discontinued state of operation and re-start of operation from the discontinued state, and actuation and utilization of a processing chamber not used for the processing route during operation. Accordingly, the known methods have failed to consider a method of operating a system, including processing chambers of the same kind which are connected to each other, wherein, when a processing chamber becomes inoperable, the operation is continued using the remaining operable processing chambers. As a result, the previously disclosed methods have a poor working efficiency.

Further, the known methods have failed to consider ways of securing the safety of an operator in the case where recovery of an abnormal processing chamber or periodic maintenance work is performed simultaneously with the usual operation of normally processing wafers.

SUMMARY OF THE INVENTION

The present invention has been made to avoid the problems inherent in the known methods.

Thus, a first object of the present invention is to provide a method of operating a vacuum processing system, including two or more of processing units for processing wafers and a transferring unit for transferring the wafers, in which the wafers are processed using at least two or more of the processing units, wherein the system can be continuously operated even when one of the processing units becomes inoperable because of a failure or the like during operation, using the remaining processing units to form a processing route, and to provide a vacuum processing system for carrying out the method.

A second object of the present invention is to provide a method of the type described, wherein, when a processing unit requires repair, the system can be operated using only the remaining operable processing chambers, and to provide a vacuum processing system for carrying out the method.

A third object of the present invention is to provide a method of the type described, which is capable of temporarily discontinuing the processing operation and re-starting the processing operation from the discontinued state; and temporarily discontinuing the processing operation, carrying out a process interruption using as the processing route a processing chamber which has not used in the processing route of the processing operation prior to the operation being discontinued, and re-starting the temporarily discontinued operation after termination of the process interruption, and to provide a vacuum processing system capable of carrying out the method.

A fourth object of the present invention is to provide a method of the type described, which, during operation of two or more of the processing chambers as a processing route, operates to issue an actuating instruction to apparatuses in a processing chamber not used for the processing route in such a way to secure the safety of the operator in the case where the actuating instruction is supplied to the apparatuses of the processing chambers not used for the processing route, particularly, by an auxiliary operating unit spaced from a main operating unit, and to provide a vacuum processing system for carrying out the method.

A fifth object of the present invention is to provide a method of the type described, which is capable of securing the safety of an operator in the case where recovery work for an abnormal processing chamber or periodic maintenance work is performed simultaneously with the usual operation of normally processing wafers, thereby improving the working efficiency of the system, while achieving an increased safety, and to provide a vacuum processing system for carrying out the method.

To achieve the above objects, according to the present invention, there is provided a processing system including: an operational information signal generating device provided in each processing unit for generating an operational information signal indicating an operable or inoperable state of the processing unit; an operational information signal storing device for storing operational information signals; and a system control device for continuously operating the system using operable ones of the processing units, without use of an inoperable processing unit, on the basis of the operational information signals.

According to a method of operating the processing system of the present invention, when a processing unit becomes inoperable because of a failure or the like during operation, operation of the system is temporarily discontinued, and it is judged by an operator whether or not the operation is to be continued. If it is decided that the operation should be continued, the operation can be continued using the remaining operable processing units.

According to the present invention, in the case where an operation is started in a state a processing unit requires repair or maintenance upon start of operation, the system can be operated using the remaining operable processing units, without use of the processing unit which requires repair or maintenance upon the start of operation.

To further achieve the above objects, according to the present invention, there is provided a method of operating a vacuum processing system and a vacuum processing system therefor, which are intended to secure the safety of an operator by providing a function wherein an air line for driving an air operation valve of each gas line is cut off (such as by use of a manually opened/closed valve) for preventing occurrence of the flow of a processing gas due to improper operation in the case where recovery work for an abnormal processing chamber or periodic maintenance work is performed simultaneously with the usual operation for normally processing wafers, and also by providing a function wherein, for example, an ON/OFF breaker for each power supply line, is used for cutting off a power supply connected to a discharging power unit for preventing electric shock due to improper actuation of the discharging power supply during the recovery or maintenance work.

BRIEF DESCRIPTION OF THE DRAWINGS

FIG. 5 is a diagram showing operational information signals of the system control device provided in the vacuum processing system shown in FIG. 1;

FIG. 6 is a diagram showing processing order information of the system control device provided in the vacuum processing system shown in FIG. 1;

FIG. 7 is a flow chart showing automatic operation by the system control device provided in the vacuum processing system shown in FIG. 1;

FIG. 8 is a flow chart showing the details of the flow of automatic operation shown in FIG. 7;

FIG. 13 is a flow chart showing operational interlocking between a main control unit and an auxiliary operation unit; and FIG. 14 shows Table 1.

DESCRIPTION OF THE PREFERRED EMBODIMENTS

Hereinafter, embodiments of the present invention will be described with reference to FIGS. 1 to 14.

Figure 1:
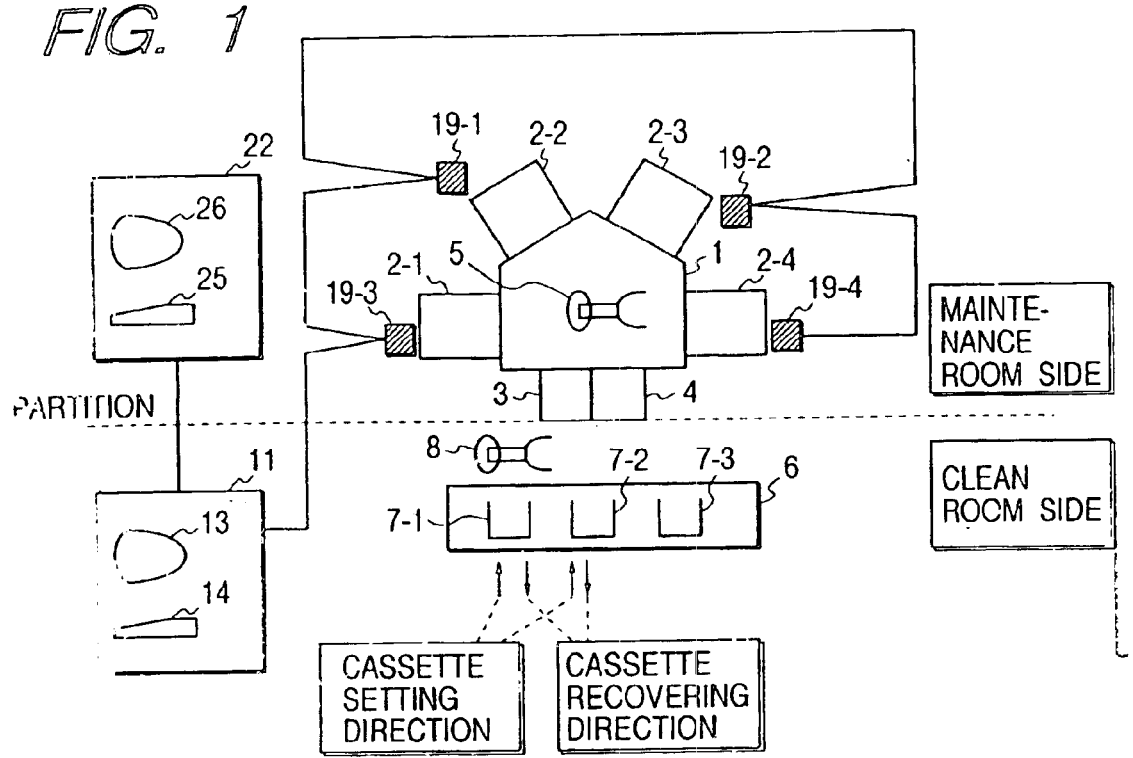
FIG. 1 is a schematic diagram of one embodiment of a vacuum processing system according to the present invention.

Referring to FIG. 1, there is shown an example of a processing system representing one embodiment of the present invention. The processing system includes four processing units, a transferring unit on which the processing units are mounted, and an atmospheric carrier disposed in front of a main body of the system. In this system, cassettes for supplying wafers into the processing units are disposed in the atmospheric carrier, and the wafers are taken out of the cassettes one by one, carried into the processing units, and processed in the processing units. It is to be noted that four or more processing units may be mounted on the transferring unit. The transferring unit, indicated by reference numeral 1, is adapted to carry each of the wafers from a load lock chamber into each of the processing units on the basis of a wafer carrying schedule and to carry a wafer which has been processed in one processing unit to the next processing unit, and finally to carry a wafer which has been processed in all of the processing units into an unload lock chamber. The processing units are indicated by reference numerals 2-1 to 2-4. Here, the processing steps include all of the typical wafer processing steps, such as etching, post-treatment, film formation, sputtering, CVD and washing. The load lock chamber, indicated by reference numeral 3, is adapted to carry wafers from the atmospheric carrier into the transferring unit. The unload lock chamber, indicated by reference numeral 4, is adapted to carry wafers from the processing units into the atmospheric carrier. The atmospheric carrier, indicated by reference numeral 6, is used for mounting cassettes containing wafers. The cassettes, indicated generally by reference numeral 7, include cassettes containing product wafers and a cassette containing cleaning wafers. Reference numeral 5 indicates a vacuum robot provided in the transferring unit for carrying wafers, and reference numeral 8 indicates an atmospheric robot for taking wafers out of the cassettes in the atmospheric carrier, inserting them into the load lock chamber 3, and for returning the wafers in the unload lock chamber 4 to the original cassette.

In the usual operation, an operator sets the cassette 7-1 (or 7-2) containing product wafers and the cassette 7-3 containing cleaning wafers in the atmospheric carrier 6. An operational condition of the system is set using a display device 13 and an input device 14 and an instruction for start of operation is given by the operator. As the operation is started, wafers are carried into the processing units 2-1, 2-2, 2-3 and/or 2-4 to be processed and returned to the original cassette after processing. When the wafers in the cassette are all processed, a buzzer (not shown) is actuated to inform the operator of the need for recovering the cassette. The cassette is thus removed by the operator.

After termination of processing with respect to the cassette or cassettes containing product wafers, the cleaning wafer is carried from the cassette 7-3 into the processing units 2-1 to 2-4, followed by cleaning of the processing units using the cleaning wafer, after which the cleaning wafer is returned to the cassette 7-3. The cleaning can be performed by sequentially carrying one cleaning dummy wafer successively into the processing unit 2-1 to 2-4, or by simultaneously carrying four cleaning dummy wafers into the respective processing units 2-1 to 2-4. Although the cleaning is performed by carrying a cleaning dummy wafer from the cassette 7-3 into the processing units 2-1 to 2-4 after termination of processing of the cassette or cassettes containing the product wafers, the cleaning may be performed without carrying the cleaning dummy wafer into the processing units 2-1 to 2-4. In addition to the cleaning performed after termination of processing of the product wafers contained in one cassette as described above, the cleaning can be performed by carrying the cleaning dummy wafer from the cassette 7-3 into the processing units 2-1 to 2-4 each time a specific number of the product wafers have been processed. However, the cleaning may be performed without carrying the cleaning dummy wafer from the cassette 7-3 into the processing units 2-1 to 2-4 each time a specific number of the product wafers are processed. In addition, the cleaning can be performed by carrying the cleaning dummy wafer from the cassette 7-3 into the processing units 2-1 to 2-4 after a specific number of cassettes containing product wafers are processed.

The above wafer processing can be performed after aging without carrying the cleaning dummy wafer from the cassette 7-3 into the processing units 2-1 to 2-4 before start of processing the cassette containing product wafers. The above wafer processing can be also performed after carrying the cleaning dummy wafer from the cassette 7-3 into the processing units 2-1 to 2-4 before start of processing the cassette containing product wafers, followed by aging for a specific number of the wafers, and then returning the dummy wafer into the cassette 7-3.

It is to be noted that the cleaning is performed for removing contaminants in a processing unit, and the aging is performed for returning the state of the interior of a processing unit to a wafer processing state before wafer processing.

The processing route as one of the operational conditions may be set by arranging symbols indicating processing units in the processing order of wafers. The processing orders of wafers are shown as operating modes in Table 1 of FIG. 14.

In the following description of the operating mode, it is assumed that the same processing (etching in this embodiment) is performed in the processing units 2-2 and 2-3, and the same processing (post-treatment in this embodiment) is performed in the processing units 2-1 and 2-4, so that each wafer is subjected to etching in the processing unit 2-2 or 2-3 and subsequently to post-treatment in the processing unit 2-1 or 2-4. In the operation of this embodiment, it is also assumed that after product wafers in one cassette are processed, a cleaning operation is performed by carrying the cleaning wafer from the cassette 7-3 to the processing unit 2-3 (or 2-2) and to the processing unit 2-4 (or 2-1). In the processing of some wafers, only etching may be performed (1) Parallel Operation of One Cassette/One Recipe In this operation, wafers to be processed in the same processing condition (hereinafter referred to as "a recipe") are sequentially taken from the lowermost or uppermost stage of a cassette, carried from the cassette into the processing units by the transferring unit, and processed in the processing units. Here, wafers are processed using routes A and B. In the route A, a wafer is subjected to etching in the processing unit 2-2 and to post-treatment in the processing unit 2-1, and is returned to the original cassette. In the route B, a wafer is subjected to etching in the processing unit 2-3 and to post-treatment in the processing unit 2-4, and is returned to the original cassette.

The processing order in this embodiment is determined by a combination of the routes A and B.

route A: cassette 7-1→processing unit 2-2→processing unit 2-1→cassette 7-1 route B: cassette 7-1→processing unit 2-3→processing unit 2-4→cassette 7-1

The processing order is not limited thereto, but also may be determined by the following combination:

route C: cassette 7-1→processing unit 2-2→processing unit 2-4→cassette 7-1 route D: cassette 7-1→processing unit 2-3→processing unit 2-1→cassette 7-1

In the above processing order, the first wafer is processed along the route A; the second wafer is processed along the route B; and the third wafer and the wafers subsequent thereto are similarly alternately processed along the routes A and B. After the final wafer is carried from the cassette 7-1

(see FIG. 3A), the cleaning wafer is carried from the cassette 7-3 into the processing unit 2-3, to clean the processing unit 2-3 (see FIG. 3B). After the final wafer in the processing unit 2-2 has been carried into the processing unit 2-1, a cleaning wafer is carried from the cassette 7-3 into the processing unit 2-2, to clean the processing unit 2-2. After termination of cleaning of the processing unit 2-3, the cleaning wafer is carried from the processing unit 2-3 into the processing unit 2-4, to clean the processing unit 2-4.

If a product wafer cassette 7-2 has been set in the carrier 6 by this time, the cassette 7-2 is processed subsequent to termination of processing of the cassette 7-1. That is, the first product wafer is carried from the cassette 7-2 into the processing unit 2-3, and is processed therein (see FIG. 3C). After termination of cleaning in the processing unit 2-4, the cleaning wafer is returned to the cassette 7-3. If the cleaning in the processing unit 2-2 is terminated by this time, the cleaning wafer is carried from the processing unit 2-2 into the processing unit 2-1, to clean the processing unit 2-1. Then, the second product wafer is carried from the cassette 7-2 into the processing unit 2-2, and is processed therein (see FIG. 3D). When the wafers in the cassette 7-1 are all processed, a buzzer (not shown) is actuated to inform an operator of termination of processing the wafers in the cassette 7-1 and of the need to exchange the cassette. The cassette 7-2 is also processed in the same processing order as that for the cassette 7-1. When the wafers in the cassette 7-2 are all processed, the buzzer is actuated to inform an operator of termination of processing the wafers in the cassette 7-2 and of the need to exchange the cassette. Such an operational cycle will be repeated. The operation is terminated by inputting an operation terminating signal at the main control unit 11.

The processing is terminated in accordance with any one of the following five modes.

a) Stop the Wafer Supply: Taking wafers out of the cassette in the course of processing is stopped (in the case of an operation using two cassettes as one lot, taking wafers out of the designated cassette is stopped).

b) Stop the Cassette Supply: Processing of all wafers in a cassette in the course of processing is continued until all wafers therein have been processed, and thereafter processing of another cassette which has been mounted by that time is prevented (in the case of an operation using two cassettes as one lot, processing of all wafers in the designated cassette is continued until all wafers therein have been processed, and thereafter processing of the other cassette which has been mounted by that time is prevented).

c) Stop of Cycle: the operating cycle is stopped directly after the present actions, such as processing, exhaust, leak, and carrying are terminated.

d) Temporary Stop of Processing Unit: operation of a designated processing unit is stopped after the present processing is terminated. In this case, the operation can be re-started from the temporary stopped state by inputting an operation re-start signal. Only the processing unit concerned can be manually re-started.

e) Immediate Stop: all of the actions in the course of operation are immediately stopped.

2) Parallel Operation of Two Cassette/One Recipe

In this operation, similar to the above "parallel operation of one cassette/one recipe", wafers to be processed in the same processing condition (or recipe) are sequentially taken from the lowermost or uppermost stage of a cassette, carried from the cassette into the processing units by the transferring unit, and processed in the processing units. This operation, however, is different from the "parallel operation of one cassette/one recipe" in terms of the processing order in which the wafers are taken out of the cassettes and carried into the processing units by the transferring unit.

For the "parallel operation of one cassette/one recipe", wafers are sequentially taken out of the same cassette, carried into the processing units by the transferring unit, and processed in the processing units; and, after termination of processing of all of the wafers in the cassette, wafers in the next cassette are started to be processed. On the contrary, in this "parallel operation of two cassette/one recipe", wafers are alternately taken out of the two cassettes 7-1 and 7-2, carried into respective processing units by the transferring unit, and are processed in the respective processing units. As in the "parallel operation of one cassette/one recipe", wafers are processed along the routes A and B. In the route A, a wafer is subjected to etching in the processing unit 2-2 and to post-treatment in the processing unit 2-1 and is returned to the original cassette. In the route B, a wafer is subjected to etching in the processing unit 2-3 and to post-treatment in the processing unit 2-4 and is returned to the original cassette. The routes C and D in the above "parallel operation of one cassette/one recipe" also may be adopted in this "parallel operation of two cassette/one recipe".

Specifically, in this operation, the first wafer is taken out of the cassette 7-1 and is processed along the route A; the second wafer is taken out of the cassette 7-2 and is processed along the route B; and the third wafer and the wafers subsequent thereto are similarly alternately taken out of the cassettes 7-1 and 7-2 and are processed along the routes A and B. After termination of processing of all of the wafers in the cassette 7-1 or 7-2, a buzzer (not shown) is actuated to inform an operator of termination of processing of the cassette 7-2 (or 7-2) and to the need to exchange the cassette. Until the terminated cassette is replaced with a new cassette, only wafers in the other cassette are continued to be processed. When the new cassette is mounted, wafers are once again alternately taken out of the cassettes 7-1 and 7-2, carried into the processing units by the transferring unit, and processed in the processing units. The same operating cycle will be repeated thereafter. The operation is terminated by inputting an operation terminating signal at the main control unit 11. The terminating modes are the same as those in the "parallel operation of one cassette/one recipe". The cleaning may be performed in the same manner as that described in the item (1) "Parallel Operation of One Cassette/One Recipe".

3) Parallel Operation of Two cassettes/Two Recipes

In this operation, since the wafer processing recipe for the cassette 7-1 is different from that for the cassette 7-2, the processing time required for processing a wafer may sometimes differ for each processing unit. In this case, the carrying of wafers from the cassettes 7-1 and 7-2 is not alternately performed, but is performed in such a manner that after a wafer is processed in one processing unit and is carried to the next processing unit, the next wafer is carried into the former processing unit. The other configuration is the same as that of the "parallel operation of two cassette/one recipe". In addition, the cleaning may be performed in the same manner as that described in the item (1) "Parallel Operation of One Cassette/One Recipe".

4) Series Operation of One Cassette/One Recipe

In this operation, similar to the above "parallel operation of one cassette/one recipe", wafers to be processed in the same processing condition (or recipe) are sequentially taken from the lowermost or uppermost stage of a cassette, carried from the cassette into the processing units by the transferring unit, and processed in the processing units. This operation, however, is different from the "parallel operation of one cassette/one recipe" in terms of the processing route. In this "series operation of one cassette/one recipe", wafers are processed along a route E in which each wafer is subjected to etching in the processing unit 2-2 (or 2-3), to etching in the processing unit 2-3 (or 2-2), and to post-treatment in the processing unit 2-1 (or 2-4), and is returned to the original cassette.

Specifically, the first wafer is processed along the route E, and the second wafer is processed along the same route E. Such an operational cycle is repeated until the final wafer in the cassette is processed. After termination of processing of all of the wafers in the cassette 7-1, a buzzer (not shown) is actuated to inform an operator of termination of processing of the cassette 7-1 and of the need to exchange the cassette. If the cassette 7-2 is mounted by that time, wafers in the cassette 7-2 are subsequently processed in the same processing order as that for the wafers in the cassette 7-1. After termination of processing of all of the wafers in the cassette 7-2, the buzzer (not shown) is actuated to inform an operator of termination of processing of the cassette 7-2 and of the need to exchange the cassette. If the next cassette 7-1 is mounted by that time, wafers in the cassette 7-1 are subsequently processed. Such an operational cycle will be repeated thereafter. The operation is terminated by inputting an operation terminating signal at the main control unit 11. The terminating modes are the same as those in the "parallel operation of one cassette/one recipe In addition, the cleaning may be performed in the same manner as that described in the item (1) "Parallel Operation of One Cassette/One Recipe".

Although the operating methods 1) to 4) have been described, such a description is for illustrative purposes only, and it is to be understood that many changes in operating method may be made by subjecting a combination of cassettes, recipes, and the kinds (parallel and series) of operation.

For maintenance of the system, the system can be operated by an operator standing on the system side using a display device 26 and an input device 25 disposed in an auxiliary operation panel 22. The auxiliary operation panel 22, represented by a portable terminal (for example, a note type personal computer), can be carried near the system. Accordingly, the operator can make use of system information (for example, ON/OFF information of input/output bit, error information, etc.) displayed on the display device 26 while visually observing the system condition during maintenance of the system. That is, the auxiliary operating panel 22 is effective to improve the operability of the maintenance work. The auxiliary operation panel 22, which has the same function as that of the main control unit 11, is further provided with a wrong operation preventive function for securing the safety of the operator. Specifically, the operating right for the system may be shifted to the auxiliary operation panel 22, in the event of which the main control unit 11 is not allowed to operate the system, and vice versa.

Figure 2:
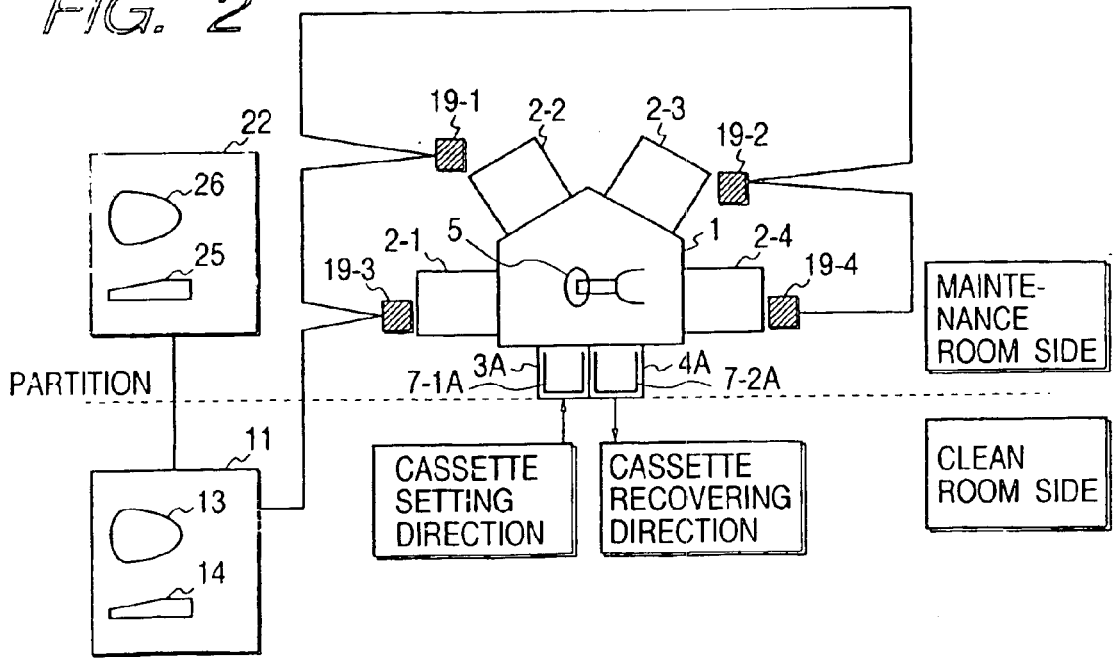
FIG. 2 is a schematic diagram of another embodiment of the vacuum processing system according to the present invention.
Figure 3:
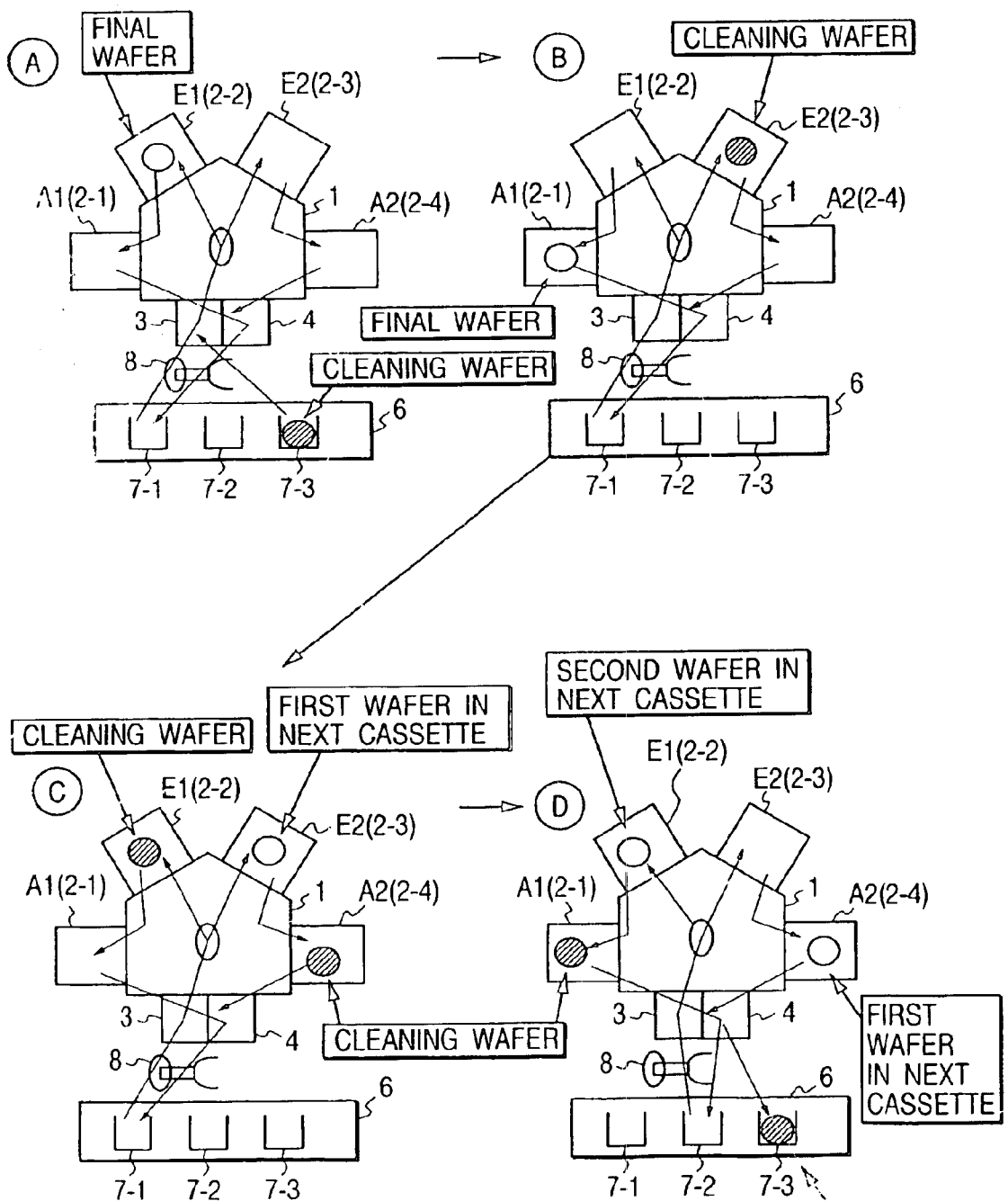
FIG. 3 is a flow diagram showing a cleaning operation according to the present invention.

FIG. 2 is a view showing one example of another embodiment of the processing system of the present invention. In this system, four processing units are mounted on a transferring unit, and a cassette for supplying wafers into the processing units is set in a load lock chamber 3A provided in a main body of the system, wherein wafers are taken out of the cassette one by one, carried into the processing units by the transferring unit, and processed in the processing units. In addition, four or more processing units may be mounted on the transferring unit.

In the configuration of the system of this embodiment, the atmospheric carrier 6 in which cassettes containing wafers are set and the atmospheric robot 8 are omitted from the configuration shown in FIG. 1. In other words, the function and configuration of this system are the same as those of the system shown in FIG. 1, except that the supply of wafers from a cassette is performed in the load lock chamber 3A and the return of the wafers to the cassette is performed in an unload lock chamber 4A. The cleaning is performed by setting a cassette containing cleaning wafers in the load lock chamber 3A (or unload lock chamber 4A), carrying the cleaning wafer into the processing units 2-1 to 2-4, cleaning the processing units using the cleaning wafer, and returning the cleaning wafer to the original cassette. The operation modes in this embodiment are as follows:

(1) Parallel Operation of One Cassette/One Recipe

In this operation, wafers to be processed in the same processing condition (recipe) are sequentially taken from the lowermost or uppermost stage of a cassette, carried from the cassette into the processing units by the transferring unit, and processed in the processing units. The wafers are processed using routes A and B. In the route A, a wafer is subjected to etching in the processing unit 2-2 and to post-treatment in the processing unit 2-1, and is returned to the original cassette. In the route B, a wafer is subjected to etching in the processing unit 2-3 and to post-treatment in the processing unit 2-4, and is returned to the original cassette.

The processing order in this embodiment is determined by a combination of the routes A and B.

route A: cassette 7-1A in load lock chamber 3A→processing unit 2-2→processing unit 2-1→cassette 7-1 in unload lock chamber 4A route B: cassette 7-1A in load lock chamber 3A→processing unit 2-3→processing unit 2-4→cassette 7-2A in unload lock chamber 4A The processing order is not limited thereto, but also may be determined by the following combination:

route C: cassette 7-1A in load lock chamber 3A→processing unit 2-2→processing unit 2-4→cassette 7-2A in unload lock chamber 4A route D: cassette 7-1A in load lock chamber 3A→processing unit 2-3→processing unit 2-1→cassette 7-2A in unload lock chamber 4A In the above processing order, the wafers which have been processed are returned to the cassette 7-2A in the unload lock chamber 4A; however, they can be returned to the cassette 7-1A, out of which they have been taken, in the load lock chamber 3A.

In connection with this embodiment, there will be described an example in which wafers taken out of a cassette 7-1A in the load lock chamber 3A are processed along the parallel routes A and B, and are returned to an initially empty cassette 7-2A in the unload lock chamber 4A. Specifically, the first wafer is processed along the route A; the second wafer is processed in the route B; and the third wafer and the wafers subsequent thereto are similarly alternately processed in the routes A and B. After termination of processing of all of the wafers in the cassette 7-1 A in the load lock chamber 3A, a buzzer (not shown) is actuated to inform an operator of termination of processing the cassette 7-1A in the load lock chamber and the cassette 7-2A in the unload lock chamber 4A and of the need to exchange the cassettes. Next, a cassette containing new wafers is set in the load lock chamber 3A and an empty cassette is set in the unload lock chamber 4A. The operating cycle will be repeated thereafter. The operation is terminated by inputting an operation terminating signal at the main control unit 11. The terminating modes are the same as those in the "parallel operation of one cassette/one recipe" in the previous embodiment.

2) Parallel Operation of Two Cassette/One Recipe

In this operation, wafers to be processed in the same processing condition (or recipe) are sequentially taken from the lowermost or uppermost stage of a cassette, carried from the cassette into the processing units by the transferring unit, and processed in the processing units.

For the above "parallel operation of one cassette/one recipe", wafers are sequentially taken out of the same cassette, carried into the processing units by the transferring unit, and processed in the processing units; and, after termination of processing of all of the wafers in the cassette, processing of wafers in the next cassette is started. However, in this "parallel operation of two cassette/one recipe", wafers are alternately taken out of the cassette 7-1A in the load lock chamber 3A and the cassette 7-2A in the unload lock chamber 4A, carried into the processing units by the transferring unit, and are processed in the processing units. As in the "parallel operation of one cassette/one recipe", the wafers are processed along the routes A and B. In the route A, a wafer is subjected to etching in the processing unit 2-2 and to post-treatment in the processing unit 2-1 and is returned to the original cassette. In the route B, a wafer is subjected to etching in the processing unit 2-3 and to post-treatment in the processing unit 2-4 and is returned to the original cassette. The routes C and D in the above"parallel operation of one cassette/one recipe" also may be adopted in this "parallel operation of two cassette/one recipe".

Specifically, the first wafer is taken out of the cassette 7-1A in the load lock chamber 3A and processed along the route A, and the second wafer is taken out of the cassette 7-2A in the unload lock chamber 4A and processed along the route B. And, this same operating cycle will be repeated until the final wafer in either of the cassettes 7-1A and 7-2A is processed. After termination of processing of all of the wafers in the cassette 7-1A in the load lock chamber 3A or the cassette 7-2A in the unload lock chamber 4A, the buzzer is actuated to inform an operator of termination of processing of the wafers in the cassette in the load lock chamber 3A or in the unload lock chamber 4A and of the need to exchange the cassette. Until the terminated cassette is removed and a new cassette is set, only wafers in the other cassette continue to be processed. When the new cassette is set, wafers are alternately taken out of the cassette in the load lock chamber 3A and the cassette in the unload lock chamber 4A, carried into the processing units by the transferring unit, and processed in the processing units. The same operating cycle will be repeated thereafter. The operation is terminated by inputting an operation terminating signal at the main control unit 11. The operating modes are the same as those in the above "parallel operation of one cassette/one recipe".

3) Parallel Operation of Two Cassettes/Two recipes

In this operation, the wafer processing recipe for the cassette 7-1A in the load lock chamber 3A may be sometimes different from the wafer processing recipe for the cassette 7-2A in the unload lock chamber 4A. In this case, the carrying of wafers from the cassettes 7-1A and 7-2A is not alternately performed, but is performed in such a manner that, after a wafer is processed in a processing unit and is carried to the next processing unit, the next wafer is carried into the former processing unit. The other features are the same as those of the above "parallel operation of two cassette/one recipe". In addition, the cleaning may be performed in the same manner as that described in the item (1) "Parallel Operation of One Cassette/One Recipe".

4) Series Operation of One Cassette/One Recipe

In this operation, similar to the above "parallel operation of one cassette/one recipe", wafers to be processed in the same processing condition (or recipe) are sequentially taken from the lowermost or uppermost stage of a cassette, carried from the cassette into the processing units by the transferring unit, and processed in the processing units. This operation, however, is different from the "parallel operation of one cassette/one recipe" in terms of the processing route. In this "series operation of one cassette/one recipe", wafers are processed along a route E in which each wafer is subjected to etching in the processing unit 2-2 (or 2-3), to etching in the processing unit 2-3 (or 2-2), and to post-treatment in the processing unit 2-1 (or 2-4), and is returned to the original cassette.

In connection with this embodiment, there will be described an example in which wafers taken out of the cassette 7-1A in the load lock chamber 3A are processed along the route E and are returned to the cassette 7-2A in the unload lock chamber 4A. The first wafer is processed along the route E, and the second wafer is also processed along the same route E. Such an operational cycle will be repeated until the final wafer in the cassette 7-1A is processed. After termination of processing of all of the wafers in the cassette 7-1A, the buzzer (not shown) is actuated to inform an operator of termination of processing the cassette 7-1A in the load lock chamber 3A and the cassette 7-2A in the unload lock chamber 7-2A and of the need to exchange the cassettes. Next, a cassette containing new wafers is set in the load lock chamber 3A and an empty cassette is set in the unload lock chamber 4A. Thus, the above operating cycle will be repeated thereafter. The operation is terminated by inputting an operation terminating signal at the main control unit 11. The terminating modes are the same as those in the "parallel operation of one cassette/one recipe".

Figure 4:
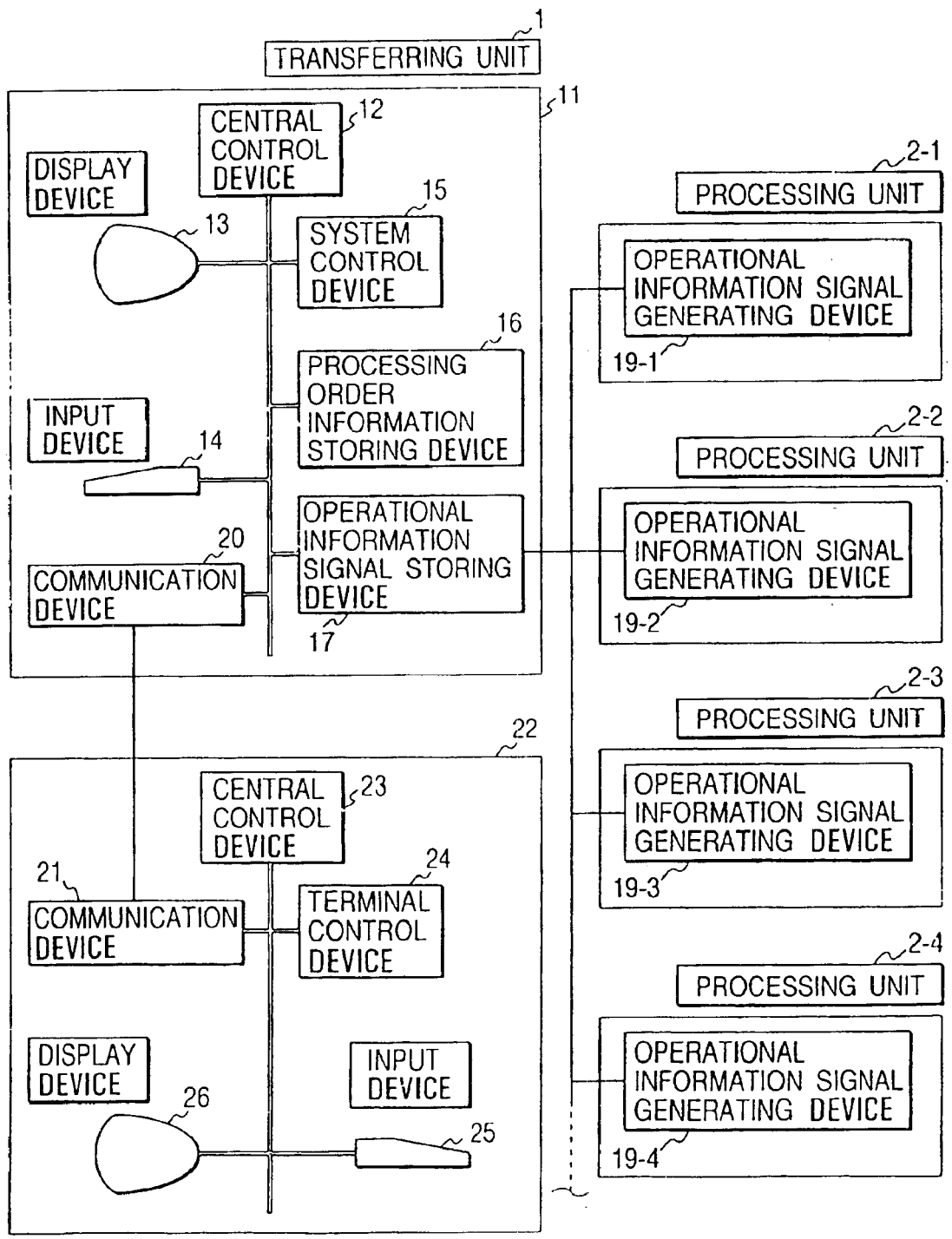
FIG. 4 is a block diagram showing a control configuration of a system control device provided in the vacuum processing system shown in FIG. 1.

FIG. 4 is a diagram showing the configuration of the main control unit 11 of the system. In this embodiment, the main control unit for entirely controlling the system is mounted in the transferring unit 1; however, it may be mounted separately from the transferring unit 1. The display device 13 and the input device 14 also may be provided separately from the main control unit. It is to be noted that, in the figure, there are illustrated only essential portions as control device, with input/output control portions (DI/O, AI/O) necessary for operation of the system being omitted. Reference numeral 16 indicates a processing order information storing device for storing processing orders of wafers in the vacuum processing system, which storing device is represented by a RAM (Random Access Memory). Data as to the processing orders of the wafers, which are inputted by an operator using the display device 13 and the input device 14 before start of operation, are stored in the processing order information storing device 16. Reference numeral 17 indicates an operational information signal storing device for storing operational information signals indicating operable/inoperable states of the processing units 2-1 to 2-4, which storing device is represented by a RAM. The display device 13 is used for displaying an operational state, setting the content of the operating condition, and instruction of the start/termination of operation, which display device is represented by a CRT. The input device 14 is used for inputting an operational condition, instruction for start of operation, processing condition, and action for maintenance, which input device is represented by a keyboard. Reference numeral 15 indicates a system control device for judging operation information signals indicating operable/inoperable states of the processing units 2-1 to 2-4 and for storing a processing order in which, when any one of the processing units 2-1 to 2-4 becomes inoperable during automatic operation, the operation is continued using the remaining operable processing units, which control device is represented by a ROM (Read Only Memory). Reference numeral 12 indicates a central control device for controlling the units 13 to 17, which control device is represented by a CPU (Central Processing Unit). The processing units 2-1 to 2-4 are used for carrying out wafer processing steps, such as etching, post-treatment, film formation, sputtering, CVD, and washing. Reference numerals 19-1 to 19-4 indicate operational information signal generating device for generating operational information signals indicating operable/inoperable states of the processing units 2-1 to 2-4. In this embodiment, the units 19-1 to 19-4 are provided in the processing units; however, they may be provided at any portions of the apparatus. The units 19-1 to 19-4 generate operational information signals by the use of:

1) cut-off signals of power supplies for the processing units;

2) operation switching signals (for example, turn on/off of switches) for setting operable/inoperable states of the processing units; and 3) input information inputted by an operator as operational control signals indicating operable/inoperable states of the processing units.

Reference numerals 20 and 21 indicate communication devices for connecting the main control unit 11 to the auxiliary operation panel 22. The auxiliary operation panel 22 includes an input device 25 and a display device 26; a terminal control device 24 for storing processing orders for controlling the terminal function at the auxiliary operation panel; and a central control device 23 for controlling the devices 21 and 24 to 26, which central control device is represented by a CPU (Central Processing Unit).

FIG. 5 is a diagram showing operational information signals. Information indicating an operable/inoperable state of each processing unit is stored. In the example shown in FIG. 5, the operable state is indicated by "1" and the inoperable state is indicated by "0". However, the operable/inoperable states may be indicated by other signal states capable of distinguishing the operable/inoperable states from each other. The information is created on the basis of a signal supplied from each of the operational information signal generating device 19-1 to 19-4, and is stored in the operational information signal storing device 17.

FIG. 6 is a diagram showing information as to the processing order. The processing order setting information is set, as one of the operating conditions, by an operator using the display device 13 and the input device 14 before start of operation. The information is stored in the processing order information storing device 17.

FIG. 7 is a flow chart showing operating steps of the system. At step 30, an operator judges before the start of operation whether or not one of the processing units 2-1 to 2-4 is inoperable because of a failure, or whether one of the processing units can not be operated for maintenance (or plasma cleaning). If the result is yes, the process goes on to step 32, at which the operational information signals for indicating operable/inoperable states of the processing units 2-1 to 2-4 (see FIG. 5) are switched using the operational information signal generating device 19-1 to 19-4. The switching of the operational information signals is performed as follows:

1) In the case of using a cut-off signal of the power supply of the processing unit, a solenoid switch of the processing unit is turned off. The cut-off signal thus generated is transmitted to the operational information signal storing device 17 and is stored as the information shown in FIG. 5.

2) In the case of using an operation switching signal (for example, turn-on/off of switch) for setting the operable or inoperable state of the processing unit, the switch allocated to the processing unit is set in the operable or inoperable state. The switching signal thus determined is transmitted to the operational information signal storing device 17 and is stored as the information shown in FIG. 5.

3) In the case of using information set by an operator as an operational control signal indicating the operable or inoperable state of the processing unit, the operator inputs the setting information allocated to the processing unit using the input device 14.

The setting information (operational information signals) thus determined is transmitted to the operational information signal storing device 17 and is stored as the information shown in FIG. 5. After the system connection state is thus determined, the process goes on to step 32 at which automatic operation is started. In addition, the processing order for wafers is set as a product processing condition as follows:

1) The operation mode for wafers is selected to be one of "parallel operation of one cassette/one recipe", "parallel operation of two cassettes/one recipe", "parallel operation of two cassettes/two recipes", and "series operation of one cassette/one recipe".

2) The carrying route of wafers is set.

The parallel or series processing route is set using symbols of the processing units for each cassette. Typical examples are as follows. It is to be noted that the processing routes for wafers can be variously set by the combination as described above.

2-1) Parallel Processing:
cassette 7-1: E1→A1, cassette 7-1: E2→A2
cassette 7-2: E1→A1, cassette 7-2: E2→A2
E1: processing unit 2-2, E2: processing unit 2-3
A1: processing unit 2-1, A2: processing unit 2-4
2-1) Series Processing
cassette 7-1: E1→E2→A1
cassette 7-2: E2→E1→A2

3) The processing condition ("process recipe") is set for each processing chamber.

After the product processing condition is thus set, automatic operation is started in step 34.

FIG. 8 is a flow chart of automatic operation of the system. When automatic operation is started, it is judged at step 40 whether or not processing of all wafers to be processed has been carried out. If yes, the processing is terminated. If no, the process goes on to step 42, at which it is judged whether or not automatic operation can be performed without the occurrence of an abnormal state. If yes, that is, in the case where there is no abnormal state, the process goes on to step 44 at which automatic operation is continued. If no, that is, in the case where there exists an inoperable processing unit, the process goes on to step 70 at which it is judged by an operator whether or not automatic operation can be continued without use of the inoperable processing unit. If no, that is, in the case where automatic operation cannot be continued, the process goes on to step 90 at which automatic operation of the system is stopped by the operator. If yes, that is, in the case where automatic operation can be continued, handling of a wafer remaining in the inoperable processing unit or an associated apparatus is required to be examined. Specifically, in this case, the wafer possibly remains in the inoperable processing unit, on a hand of the vacuum robot, or in the load lock chamber or unload lock chamber. To re-start automatic operation from the state that automatic operation is temporarily discontinued because an abnormal state occurs during automatic operation, the wafer remaining in the inoperable processing unit or the associated apparatus must be returned to the original cassette. The reason for this is as follows: namely, since the carrying/processing schedule for all of the wafers in the processing units is established at the time of occurrence of the abnormal state during automatic operation, the schedule will become disrupted unless the wafer remaining in the inoperable processing unit or the associated apparatus is returned to the cassette, with a result that re-start of automatic operation from the temporarily discontinued state becomes impossible.

As another example, automatic operation for the normal wafers may be re-started from the temporarily discontinued state while the wafer remaining in the abnormal processing unit or apparatus is not returned to the original cassette, that is, left as it is. In this case, the remaining wafer is returned to the original cassette after termination of automatic operation for the normal wafers. As a further example, the wafer information may be changed as if the remaining wafer was returned into the original cassette. For example, with the wafer remaining in the abnormal processing unit being left as it is, the wafer information is changed as if the wafer was carried to the original cassette, and automatic operation for the normal wafers (one lot) is re-started from the temporarily discontinued state. In this case, the remaining wafer is returned to the original cassette after termination of automatic operation for the normal wafers. The wafer remaining in the inoperable processing unit will be handled in accordance with the flow chart of FIG. 8.

At step 72, it is judged whether or not a wafer exists in the inoperable processing unit. If yes, the process goes on to step 73, at which it is judged whether or not automatic operation can be continued with the wafer remaining in the inoperable processing unit being left as it is. If yes, that is, in the case where automatic operation can be continued with the remaining wafer being left as it is, the process goes on to step 77, at which the wafer information is changed as if the remaining wafer was carried into the original cassette. If no, that is, in the case where automatic operation is not continued with the remaining wafer being left as it is, the process goes on to step 74, at which it is judged whether or not the remaining wafer is required to be etched. If yes, that is, in the case where an abnormal state occurs midway of the etching step, the process goes on to step 76, at which the remaining wafer is subjected to the remainder of the etching step. And, in step 78, the remaining wafer is returned to the original cassette. Such a process is performed to help the wafer remaining in the abnormal processing unit as far as possible. If the wafer remains on a wafer hand of the vacuum robot, or in the load lock chamber or unload lock chamber, it is returned to the original cassette (step 78) after performing the operation necessary for the apparatus (exhaust/leak of the lock chamber, or carrying of wafer). In this way, the wafer in the inoperable processing unit, or the associated apparatus, undergoes a necessary measure and is returned to the original cassette, and then automatic operation is restarted from the temporarily discontinued state. With this handling, the tracking information of the wafer in the abnormal processing unit or apparatus (for example, vacuum robot) becomes equal to that of a wafer which has been processed along the normal route. Thus, automatic operation can be re-started. After handling the wafer remaining in the inoperable processing unit, the process goes on to step 80, at which the operational information is switched using the operational information signal generating device in the same manner as that described in step 32 of FIG. 7. The process goes on to step 82 at which the abnormal state generation information is re-set, thus continuing automatic operation.

Next, there will be described automatic operation in the normal state. In step 44, the information stored in the processing order information storing device 16 is read out, and in step 46, the carrying route for the next wafer is determined by comparing the information thus read out from the device 16 with the information stored in the operational information signal storing device 17. The determined carrying route may have carrying route data for each wafer carried from the cassette, or may be referred to a processing order information table prepared separately from the processing order information storing device 16 when the wafer is carried. After the carrying route is determined, a wafer is carried out of the cassette by the atmospheric robot (step 48), carried into the processing unit registered in the determined carrying route (at step 50), and processed (step 52). In the case where an abnormal state occurs in the operation of carrying and processing wafers, the processing steps, which are allowed to be continued, are continued to completion, and then automatic operation is temporarily discontinued. For example, when an abnormal state occurs during etching of the N-th wafer, the etching step is continued until the etching of the N-th wafer is terminated, and then automatic operation is temporarily discontinued. Also, in the case where, during the carrying of a wafer using the vacuum robot 5, there occurs an abnormal state in a different processing step, the vacuum robot 5 continues to carry the wafer to a specific point, and then automatic operation is temporarily discontinued. Then, abnormal state generation information (not shown) indicating the generation of an abnormal state is stored, and thereafter, the temporarily discontinued state of the system is displayed on the display device 13 with the buzzer (not shown) being actuated in order to inform an operator of the temporarily discontinued state. After that, the process is returned to step 42, at which the processing is performed under the specific flow.

Figure 9:
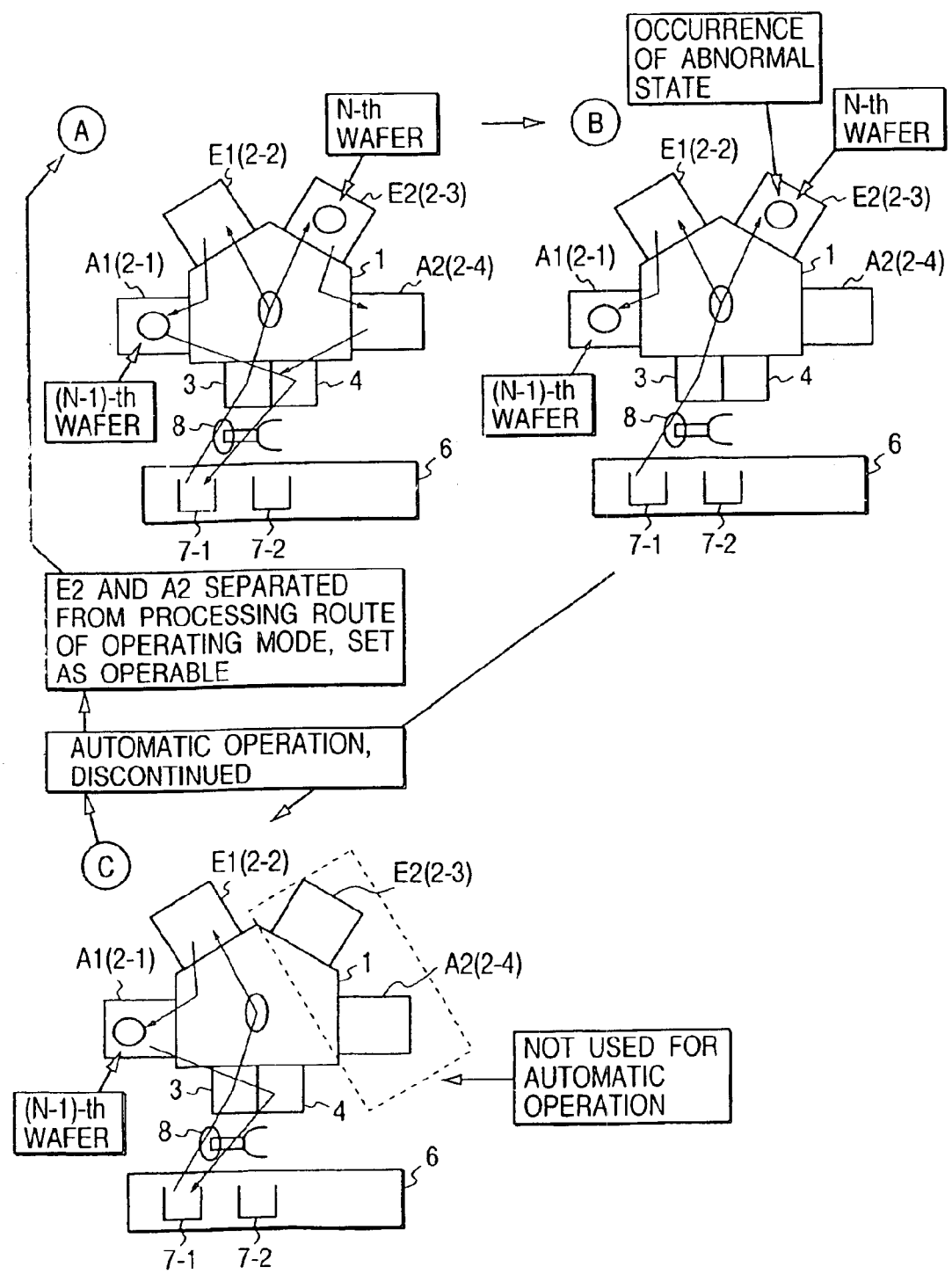
FIG. 9 is a flow diagram showing an operational state upon re-start of automatic operation after generation of an abnormal state in the vacuum processing system shown in FIG. 1.

FIG. 9 is a view showing re-start of automatic operation after the occurrence of an abnormal state. The processing until re-start of automatic operation after an abnormal state occurs during the automatic operation described with reference to FIG. 8 will be described. Referring to FIG. 9A, the system is operated in the "parallel operation of one cassette/ one recipe" mode and with the following carrying routes:

cassette 7-1: E1→A1 and E2→A2
cassette 7-2: E1→A1 and E2→A2

Here, it is assumed that when the N-th wafer is subjected to etching in E2 and the (N−1)-th wafer is subjected to post-treatment in A1, an abnormal state occurs in E2 as shown in FIG. 9B. In this case, the post-treatment of the (N−1)-th wafer in A1, which has been already etched, is continued to completion, and thereafter automatic operation is temporarily discontinued without carrying the (N−1)-th wafer into the unload lock chamber 4. The N-th wafer in E2 where the abnormal state occurs is handled as described in steps 76 and 78 of FIG. 7. With respect to E2 and A2, the operational information is switched using the operational information signal generating device as described in step 80 of FIG. 8. Specifically, the operational information is switched in accordance with any one of the operations 1), 2) or 3) described with reference to FIG. 7, so that the operational information of each of the processing units 3 (E2) and 4 (A2) is set at "inoperable: 0" as shown in FIG. 5. Then, the abnormal state generation information is reset (see step 80 in FIG. 8), to re-start automatic operation. After re-start of automatic operation, the (N−1)-th wafer in A2 is carried into the unload lock chamber 4 as shown in FIG. 9C. The processing is continued using E1 and A1 thereafter.

Next, with reference to the processing units 3 (E2) and 4 (A2) regarded as "inoperable: 0", apparatuses in the processing units 4 (E2) and 4 (A2) are actuated to search for the cause of the abnormal state using the auxiliary operation panel 22. For example, the action of the processing unit 3 (E2) is confirmed by performing a wafer pushing operation (not shown).

Next, there will be described a procedure in which the processing units 3 (E2) and 4 (A2) regarded as "inoperable: 0" are returned to the processing route of wafers after the cause of the abnormal state is made clear by the above operation. Specifically, automatic operation shown in FIG. 9C is temporarily discontinued, and the operating state is returned to that shown in FIG. 9A by setting operable E2 and A2, which have been separated from the processing route.

Thus, the wafers can be operated on in the following carrying routes:
cassette 7-1: E1→A1 and E2→A2
cassette 7-2: E1→A1 and E2→A2

Figure 10:
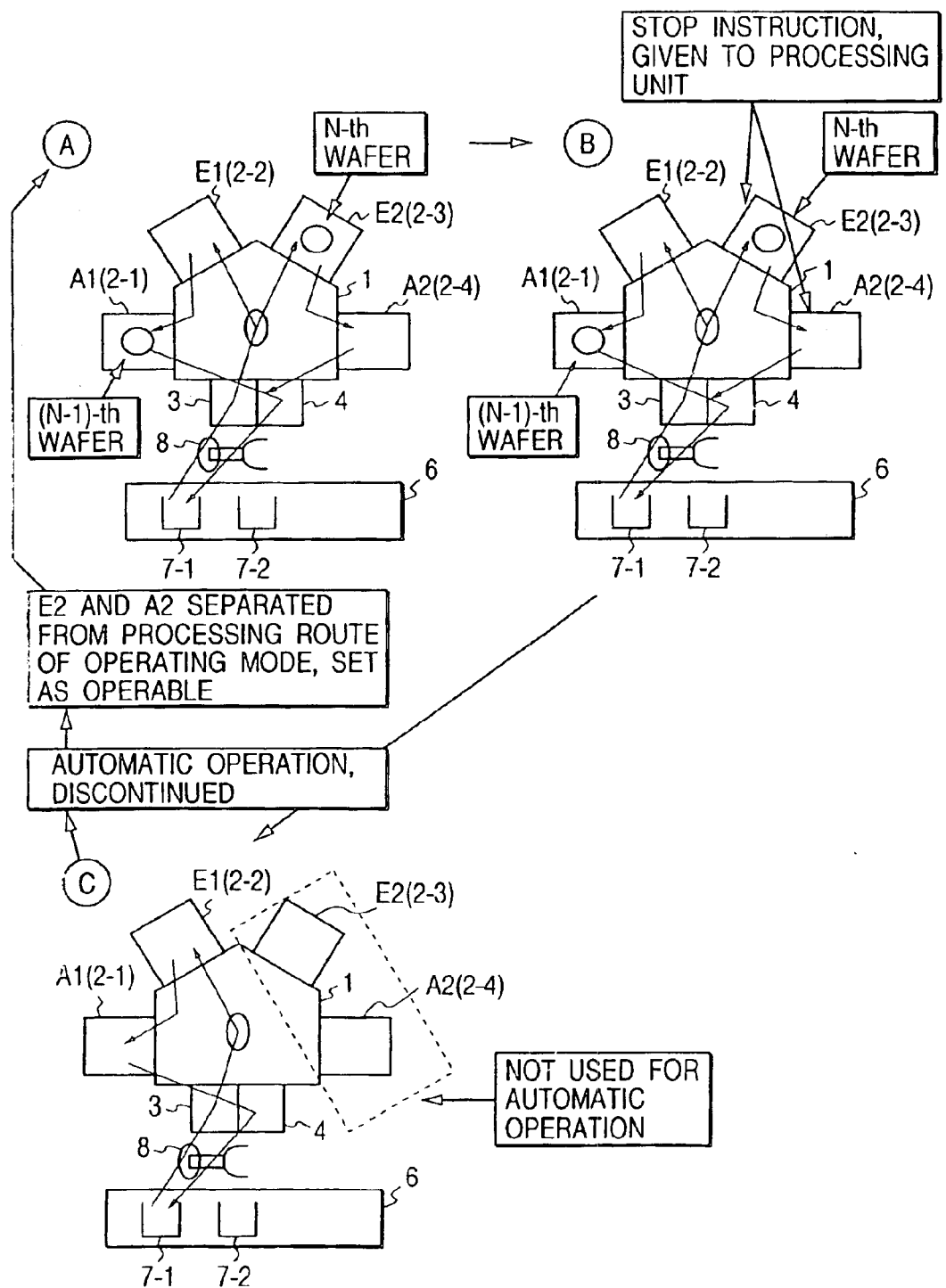
FIG. 10 is a flow diagram showing an operational state in which processing units are separated during automatic operation in the vacuum processing system shown in FIG. 1.

FIG. 10 is a view showing the operation of separating a processing unit from a processing route during automatic operation. Hereinafter, there will be described an operation of re-starting automatic operation after E2 and A2 are separated from a processing route of automatic operation described with reference to FIG. 8. The operating route shown in FIG. 10A is the same as that shown in FIG. 9A. That is, the system is operated in the "parallel operation of one cassette/one recipe" mode in Table 1 of FIG. 14 and the following carrying routes:
cassette 7-1: E1→A1 and E2→A2
cassette 7-2: E1→A1 and E2→A2

Here, it is assumed that when the N-th wafer is subjected to etching in E2 and the (N−1)-th wafer is subjected to post-treatment in A1, instructions are given to stop operation of E2 and A2 as shown in FIG. 10A by performing an operation stop action. In this case, the (N−1)-th wafer in A1 is returned to the original cassette after termination of post-treatment; and, the N-th wafer in A1 is carried into A2 after termination of etching, is subjected to post-treatment in A2, and is returned to the original cassette after termination of post-treatment. Incidentally, since E2 and A2 are in the operation stop state, the (N+1)-th wafer and the wafers subsequent thereto continue to be operated on using E1 and A1.

In the above example, E2 and A2 are separated from the processing route during automatic operation by issuing stop instructions through the operation stop action; however, the stop instructions can be obtained from detectors assembled in the processing units. As one example, when contaminant monitors assembled in the processing units E2 and A2 detect that monitored values are more than predetermined values, stop instructions similar to those described above can be given to E2 and A2 during automatic operation on the basis of the detected results.

The procedure for returning the separated processing units into the processing route is the same as that described with reference to FIG. 9.

Figure 11:
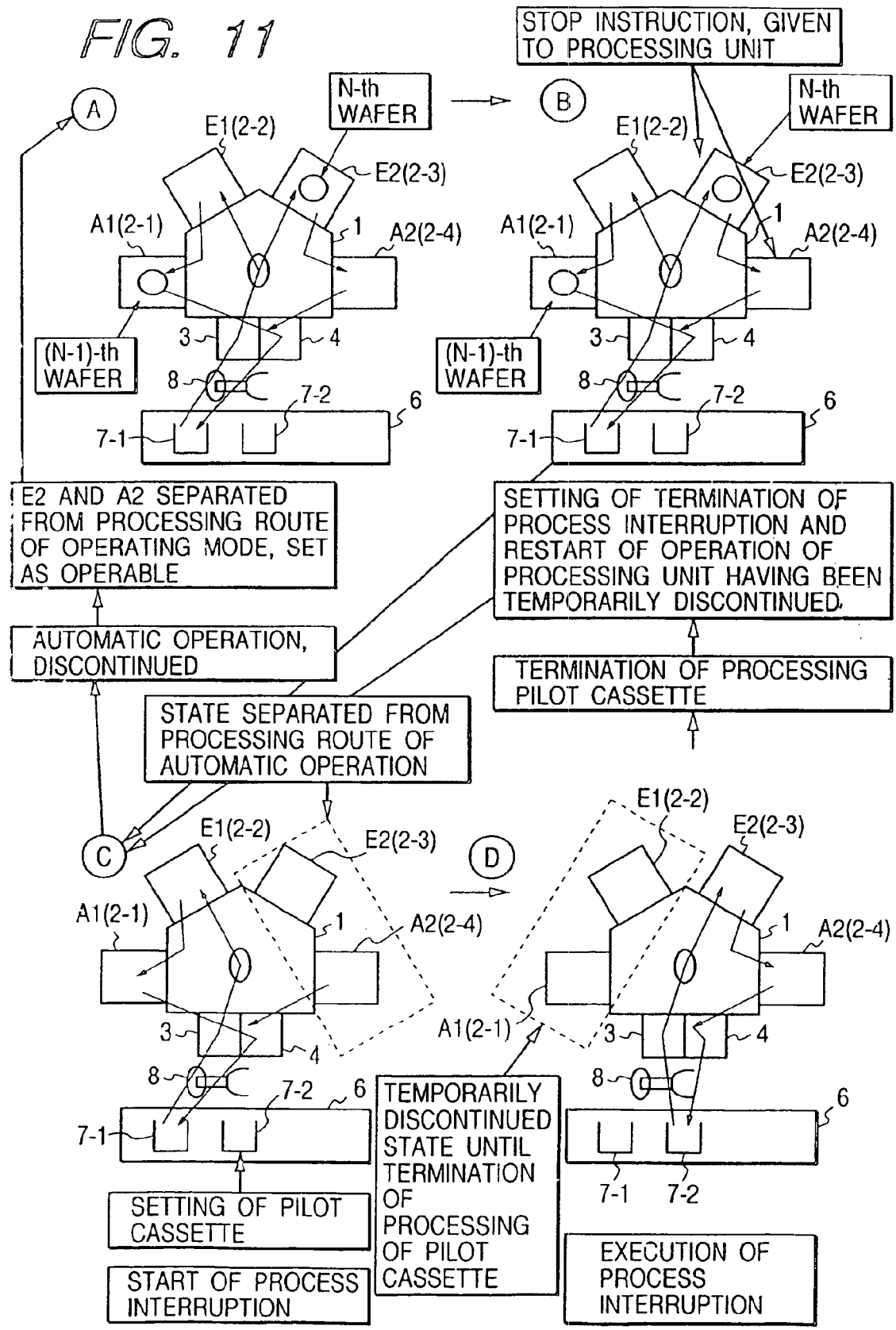
FIG. 11 is a flow diagram showing a change in operating state upon processing of a pilot cassette during automatic operation in the vacuum processing system shown in FIG. 1.

FIG. 11 is a view showing processing of a pilot cassette, in which a process interruption is generated during automatic operation and the original processing is re-started after termination of the interruption. During automatic operation described with reference to FIG. 8, specific processing units (E2 and A2 in this example) are separated from the present processing route, and the processing of a cassette (called a pilot cassette) to be processed in a processing condition different from the present processing condition is interrupted and the pilot cassette is processed using the separated units E2 and A2. After termination of processing of the pilot cassette, the original automatic operation is re-started. Such a process interruption will be more clearly described below. The operating route shown in FIG. 11A is the same as that shown in FIG. 9. That is, the system is operated in the "parallel operation of one cassette/one recipe" mode in Table 1 of FIG. 14 and with the following carrying route:
cassette 7-1: E1→A1 and E2→A2
cassette 7-2: E1→A1 and E2→A2

When the N-th wafer in the cassette 7-1 is subjected to etching in unit E2 and the (N−1)-th wafer in the cassette 7-1 is subjected to post-treatment in unit A1, automatic operation is discontinued for performing an emergency process interruption using units E2 and A2 as shown in FIG. 11A. When stop instructions are given to units E2 and A2 by an operation stop action, the (N−1)-th wafer in unit A1 is returned to the original cassette after termination of post-treatment, and the N-th wafer is carried into unit A2 after termination of etching, is subjected to post-treatment, and is returned to the original cassette. Incidentally, since units E2 and A2 are in the operation stop state, the (N+1)-th wafer and the wafer subsequent thereto continue to be operated using units E1 and A1 (see FIG. 11C). During operation using units E1 and A1, the pilot cassette used for emergency process interruption using units E2 and A2 is replaced with the cassette 7-2, followed by start of the process interruption (see FIG. 11C), and the wafers which have been taken out of the cassette 7-1 until that time are all processed and carried into the cassette 7-1. At this time, processing for the wafers in the cassette 7-1 using units E1 and A1 is temporarily discontinued, and processing of wafers in the pilot cassette 7-2 for emergency process interruption is started (see FIG. 11D). The wafers in the pilot cassette 7-2 are sequentially processed in the order of E2→A2, and carried into the pilot cassette 7-2. After termination of processing of the pilot cassette 7-2, termination of the interruption and re-start of operation from the temporarily discontinued state is set, and processing of wafers from the cassette 7-1, which has been discontinued, is re-started (returned to the state shown in FIG. 1C). Next, during operation in the state shown in FIG. 11C, automatic operation is discontinued, and then the operating state is returned to that shown in FIG. 11A by setting operable units E2 and A2, which have been separated from the processing route. Thus, the system can be operated in the following processing routes:
cassette 7-1: E1→A1 and E2→A2
cassette 7-2: E1→A1 and E2→A2

Figure 12:
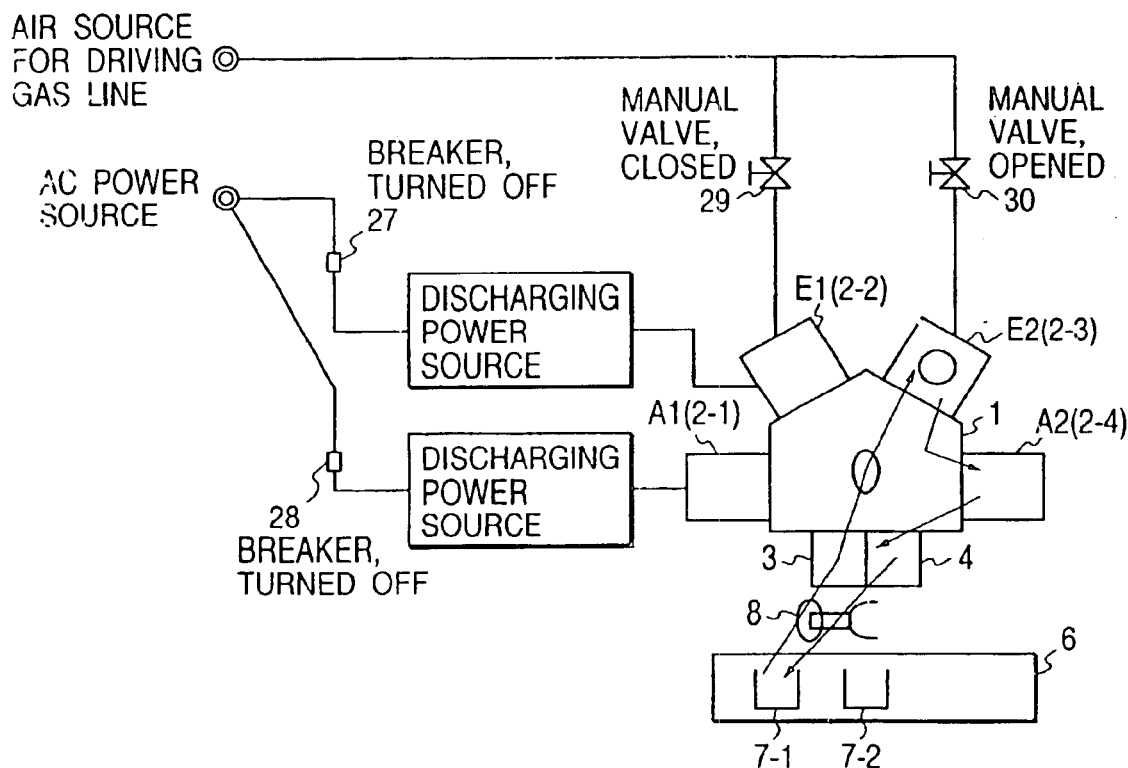
FIG. 12 is a schematic diagram showing separation of processing units in the vacuum processing system.

FIG. 12 shows air-line and power supply cutting off configurations of the vacuum processing system for the processing units. Each of the processing units 2-1 to 2-4 is provided with a manually operated opened/closed valve for cutting off an air line for driving an air operation valve for each processing gas, and a breaker for turning on/off a power supply, thereby cutting off the power supplied to a discharge power supply unit. In connection with this embodiment, there will be described a "parallel operation of one cassette/one recipe" for processing wafers using the processing units 2-3 and 2-4 simultaneously with the performing of maintenance work for exchanging an electrode in the processing unit 2-2. In addition, only the configurations of those of the processing units necessary for the description are illustrated in the figure.

The operation of the system is performed along routes A and B (see the embodiment shown in FIG. 1). Here, since the processing unit 2-2 is undergoing maintenance work, the valve 29 for manually opening/closing the air line for driving the air operation valve of the gas line in the processing unit 2-2 is closed, and the breakers 27 and 28 for power supplied to the discharge power supply unit are turned off to cut off power to the processing units 2-2 and 2-1. Thus, the system is operated as shown in FIG. 7. Accordingly, even when an operation which allows processing gas to flow in the processing unit 2-2 during maintenance is erroneously performed, the processing gas does not flow because the air line for driving the air operation valve for the gas line is cut off. Even when the discharge power supply is erroneously turned on, an operator does not suffer from electric shock because the power supplied to the discharge power supply unit is cut off. In this way, even when the usual water processing is performed simultaneously with the maintenance work for the system and apparatuses by an operator standing on the system side of the apparatuses of the working system, the operator does not suffer from the processing gas flowing due to a wrong operation and/or electric shock due to turn-on of the discharge power supply. As a result, it is possible to secure the safety of the operator.

FIG. 13 is a flow chart of interlocking operation between the main control unit and an auxiliary operation panel, when the processing unit 2-2 is operated using the auxiliary operation panel 22 during operation of the system shown in FIG. 1 by the main control unit 11.

If the operation right for the processing unit 2-2 is shifted from the main control unit 11 to the auxiliary operation panel 22 before operation of the processing unit 2-2 by the auxiliary operation panel 22 (step 102), the main control unit 11 cannot operate the processing unit 2-2 until it receives the operating right (step 106). And, the auxiliary operation panel 22, when it receives the operating right for the processing unit 2-2 (step 104), then can operate the processing unit 22 (step 108). After termination of the operation of the processing unit 2-2 by the auxiliary operation panel 22 (step 110), the operating right is shifted from the auxiliary operation panel 22 to the main operating unit 11 (step 112), after which the auxiliary operation panel 22 cannot operate the processing unit 2-2 (step 114). The main control unit 11, when it receives the operating right for the processing unit 11 (step 116), then can operate the processing unit 11 (step 118). In this case, the main control unit 11 can operate all of the processing units (step 120).

As described above, information concerning a processing unit which is inoperable because of a failure or the like, or a processing unit can not be used because of repair or maintenance (including plasma cleaning), is stored in the operational information signal storing device 17, and the system control device allows operation of the system on the basis of the information stored in the storing device 17. As a result, a wafer is not carried in the processing unit which is set as inoperable. In the case of carrying out repair and maintenance of the inoperable processing unit and searching for the cause thereof, operations, such as plasma cleaning, gas line exhaust, lifting/lowering action of a wafer pusher for maintenance work or the like, can be performed on the side apart from the other apparatuses of the processing unit, simultaneously with automatic operation for processing wafers. In the case of performing operations for carrying out repair and maintenance and searching for the cause of the abnormal state on the side of the apparatuses of the inoperable processing unit, the above auxiliary operation panel 22 is used. Incidentally, in the usual production line, the atmospheric carrier 6 shown in FIG. 1 is disposed on the clean room side and the transferring unit 1 and the processing units 2-1 to 2-4 are disposed on the maintenance room side, and the clean room side is partitioned from the maintenance room side by a partition. Accordingly, in some cases, one of the sides can not be sufficiently viewed from the other side. Also, the auxiliary operation panel 22, which is connected to the main control unit 11, is usually operated at a location spaced from the main control unit 11. In these cases, if the system is allowed to be operated by the main control unit 11 and the auxiliary operation panel 22, when the system is operated using the auxiliary operation panel 22 particularly on the maintenance room side, there is the possibility that an accident to the operator will occur. To prevent occurrence of such an accident, when an operation (for example, lifting/lowering action for pushing a wafer) is performed for a processing unit using the auxiliary operation panel 22, the main control unit 11 is interlocked as shown in FIG. 13 for preventing the operation for the processing unit from being performed by the main control unit 11.

Thus, during an automatic operation for processing wafers, an operation can be carried out for performing secondary processing using a processing unit not used in the main wafer processing or of actuating the processing unit.

The present invention is particularly effective in the case where a processing unit is made inoperable because of a failure or the like midway in the operation; the case where automatic operation is started in a state where there exists a processing unit required to be subjected to repair or maintenance at the time of start of operation; and the case where, during an operation by operable processing units without use of a discontinued processing unit, the operation of the discontinued processing unit is re-started. Specifically, according to the vacuum processing system of the present invention, including a plurality of wafer processing units and a wafer transferring unit, even when any one of the processing units becomes inoperable because of a failure, the operation can be continued; and even when a processing unit requires repair or maintenance upon start of operation, operation can be performed using operable processing units. This makes it possible to increase the working efficiency. According to the vacuum processing system, moreover, in the case where the recovery of an abnormal processing unit or periodic maintenance work is performed on the side of apparatuses of the processing unit simultaneously with the usual operation of normally processing wafers, an operator will not suffer from a processing gas flowing due to an improper operation and/or an electric shock due to erroneous turn-on of a discharging power supply. This makes it possible to secure the safety of the operator.

What is claimed is:

1. A vacuum processing method using a vacuum processing system having a plurality of processing units for conducting wafer processing, one transfer processing unit for transferring wafers to each of the processing units, an atmospheric transfer unit for mounting a plurality of cassettes which store wafers therein, a transfer unit for enabling a wafer to be removed from any of the cassettes of the atmospheric transfer unit, and a control unit for controlling an automatic operation including transfer of a wafer from any one of the cassettes to the transfer unit, the transfer processing unit and the processing units, wherein the vacuum processing system includes a processing order information storing device for storing a processing order of the wafers in the processing units, an operational information signal generating device for generating an operational information signal indicating an operable or inoperable state of each of the processing units, an operational information signal storing device for storing the operational information signal indicating an operable or inoperable state of each of the processing units, and a system control device for matching and processing the processing order information and the operational information signal, and continuing operation without using an inoperable processing unit while using other operable processing units, the method comprising the steps of:

setting the operational information signal of one of the processing units having been set to the operable state to the inoperable state, during operation of the processing unit;

setting the inoperable set operational information signal of the processing units having been set to the inoperable state to the operable state; and incorporating the processing units into a processing mute of the wafers so as to continue the processing of the wafers.

2. A vacuum processing method according to claim 1, wherein the processing units set to the inoperable state conduct a processing different from the processing conducted before the operational information signal has been set inoperable.

3. A vacuum processing method according to claim 1, wherein said processing units set to the inoperable state are instructable to operate during a period in which the operational information state is set inoperable.

4. A vacuum processing apparatus including a plurality of processing units for conducting wafer processing, one transfer processing unit for transferring wafers to each of the processing units, an atmospheric transfer unit for mounting a plurality of cassettes which store wafers therein, a transfer unit for enabling a wafer to be removed from any of the cassettes of the atmospheric transfer unit, and a control unit for controlling an automatic operation including transfer of a wafer from any one of the cassettes to the transfer unit, the transfer processing unit and the processing units, comprising:

a processing order information storing device for storing a processing order of the wafers in the processing units;

an operational information signal generating device for generating an operational information signal indicating an operable or inoperable state of each of the processing units;

an operational information signal storing device for storing the operational information signal indicating an operable or inoperable state of each of the processing units; and an apparatus control device for matching and processing the processing order information and the operational information signal, and continuing operation without using an inoperable processing unit while using other operable processing units;

wherein the operational information signal generation device enables setting of the operational information signal inoperable during operation of the unit, enables setting of the inoperable set operational information signal operable, and enables incorporation of the processing units having been set to the inoperable state again into a processing route of the wafers.

5. A vacuum processing apparatus according to claim 4, wherein the processing units set to the inoperable state enable conducting of a processing different from the processing conducted before the operational information signal has been set inoperable.

6. A vacuum processing apparatus according to claim 4, wherein the processing units set to the inoperable state are instructable to operate during a period in which the operational information signal is set inoperable.

7. A vacuum processing apparatus for processing a wafer under application of a plurality of processing units for conducting processing, having a transfer processing unit for transferring wafers to each of the processing units, an atmospheric transfer unit for mounting a plurality of cassettes which store wafers therein, a transfer unit for enabling a wafer to be removed from any of the cassettes of the atmospheric transfer unit, and a control unit for controlling an automatic operation including transfer of a wafer from any one of the cassettes to the transfer unit, the transfer processing unit and the processing units, and a stop means operated during an operation of the vacuum processing apparatus for at least temporarily stopping an automatic operation of the vacuum processing apparatus, the vacuum processing apparatus comprising:

a device for determining whether or not a residual wafer is present in one of the processing units of the vacuum processing apparatus;

a device for determining whether or not the residual wafer is undergoing an etching processing;

a device for returning the residual wafer to the cassette from which the residual wafer originated after performing the etching processing when the residual wafer is present in the one of the processing units when the etching process is being carried out; and a device for restarting the automatic operation of the vacuum processing apparatus from a temporary stopped state by restarting operation after the temporary stopped state of the automatic operation of the vacuum processing apparatus.

8. A vacuum processing apparatus according to claim 7, further comprising a device for returning another residual wafer to the cassette from which the another residual wafer originated when the another residual wafer is present in another one of the processing units.

9. A vacuum processing apparatus for processing a wafer under application of a plurality of processing units for conducting processing, having a transfer processing unit for transferring wafers to each of the processing units, an atmospheric transfer unit for mounting a plurality of cassettes which store wafers therein, a transfer unit for enabling a wafer to be removed from any of the cassettes of the atmospheric transfer unit, and a control unit for controlling an automatic operation including transfer of a wafer from any one of the cassettes to the transfer unit, the transfer processing unit and the processing units, and a device for ending an operation of the vacuum processing apparatus, the vacuum processing apparatus comprising:

a device for stopping removal of a wafer from a cassette of which a wafer thereof is being processed or a specified cassette;

a device for stopping wafer processing from a subsequent cassette, which is mounted in the atmospheric transfer unit by the time when all the wafer processing of the wafers from the cassette being processed or the specified cassette is ended, after all the processing is ended;

a device for at least temporarily stopping the automatic operation of the vacuum processing apparatus after an end of the processing of wafers being processed for a specific processing unit; and a device for restarting an operation of the vacuum processing apparatus from a temporarily stopped state by the restarting of the automatic operation after the temporary stopping of an automatic operation of the vacuum processing apparatus.

10. A vacuum processing apparatus according to claim 9, further comprising a device for stopping operation under execution of the processing of the wafers, exhausting gas, leaking and transferring after an end of each operation on the spot, and a device for stopping every operation under execution immediately.

* * * * *